United States Patent [19]
Nyce

[11] Patent Number: 5,640,109
[45] Date of Patent: Jun. 17, 1997

[54] PULSE DETECTOR

[75] Inventor: David S. Nyce, Apex, N.C.

[73] Assignee: MTS Systems Corporation, Cary, N.C.

[21] Appl. No.: 549,491

[22] Filed: Oct. 27, 1995

[51] Int. Cl.$^6$ .................................................. H03K 5/153
[52] U.S. Cl. .................................. 327/73; 327/58; 327/60
[58] Field of Search ................................ 327/58, 60, 73

[56] References Cited

U.S. PATENT DOCUMENTS

| | | | |
|---|---|---|---|
| 3,613,012 | 10/1971 | Feistel | 325/474 |
| 3,710,614 | 1/1973 | Oppliger | 73/59 |
| 4,772,131 | 9/1988 | Varela et al. | 374/119 |
| 4,789,838 | 12/1988 | Cheng | 327/58 |
| 4,833,418 | 5/1989 | Quintus et al. | 330/9 |
| 5,117,119 | 5/1992 | Schubert et al. | 250/559 |
| 5,131,271 | 7/1992 | Haynes et al. | 73/290 |
| 5,142,142 | 8/1992 | Senechalle et al. | 250/227.23 |
| 5,399,911 | 3/1995 | Tarricone et al. | 327/50 |
| 5,561,469 | 10/1996 | Schultz | 348/476 |

*Primary Examiner*—Margaret Rose Wambach
*Attorney, Agent, or Firm*—Kinney & Lange, P.A.

[57] ABSTRACT

A pulse detection system for detecting pulses of sufficient magnitudes using a control detector providing crossing indications of pulses going beyond a threshold value, a stored threshold crossing adjustable actuator representing at least portions of selected crossing indications previously stored therein but reduced in magnitude as controlled by a magnitude reduction controller acting over time. An output detector may be used to detect signals going beyond another threshold.

6 Claims, 10 Drawing Sheets

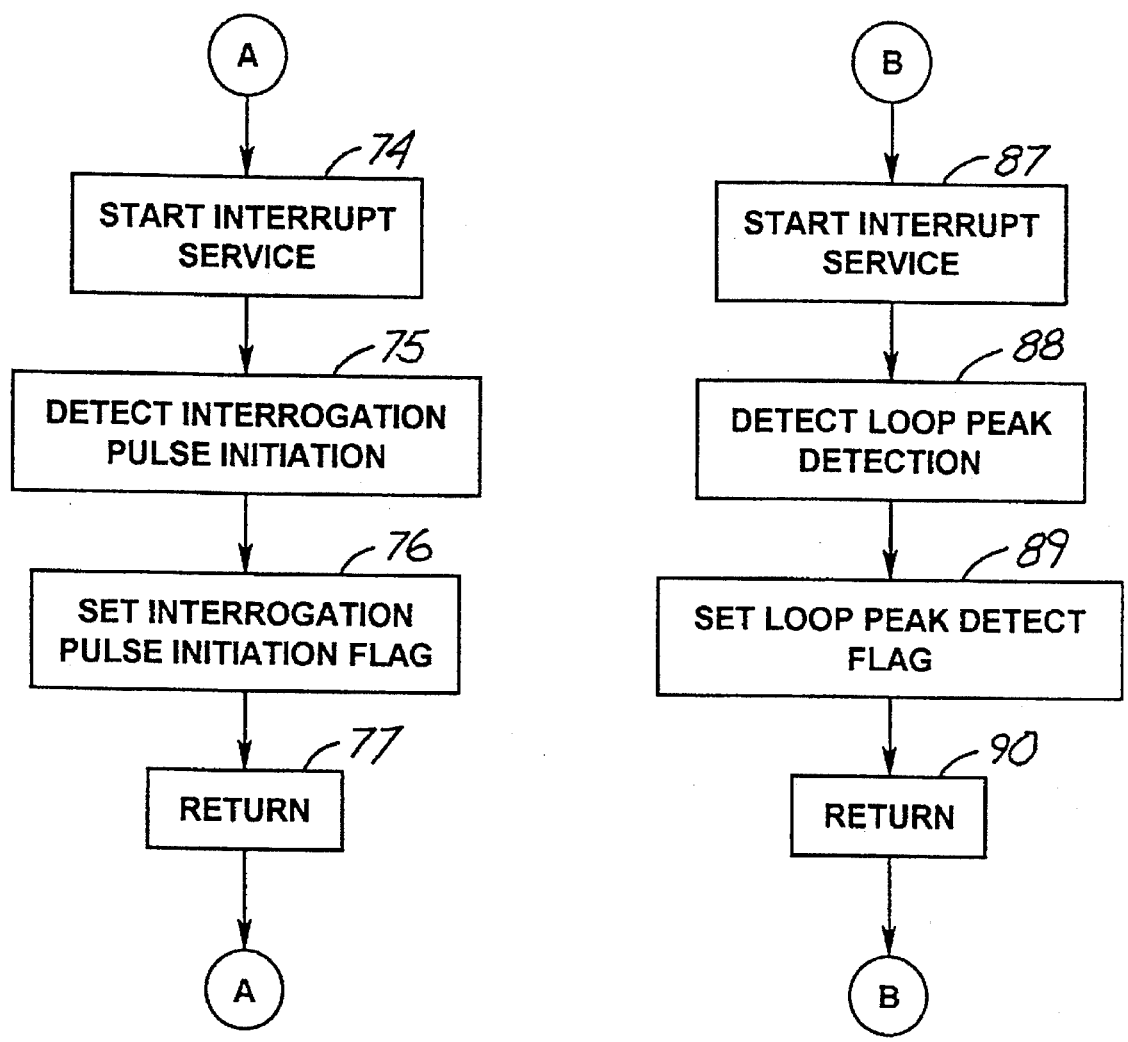

PULSE DETECTOR

BACKGROUND OF THE INVENTION

The present invention relates to systems for detecting electrical signal pulses and, more particularly, for detecting pulses subject to varying peak amplitudes.

Electrical pulses, that is, substantial changes in magnitude level of an electrical variable over a relatively short time, are generated during the operation of various electrical devices and are often used to transmit information. One such device is a sonic waveguide based relative translation distance measuring system, or instrument. In such system, an electrical current pulse is applied through an electrical conductor wire encased in a ferromagnetic magnetic material waveguide tube, or alternatively, through a ferromagnetic material electrical conductor rod that also serves as the sonic waveguide. An external magnet, serving as a position marker by being guided along the tube to have a position there along that is dependent on the distance to be measured, provides a magnetic field which interacts with the translating magnetic field established by the current pulse applied through the wire or rod. That interaction results in a torque on the waveguide, whether tube or conductor, at the location of the interaction to thus provide a torsion pulse at that location in the sonic waveguide that is transmitted along that waveguide including back toward the source of the current pulse. The time duration between the initiation of the current pulse and the receiving of the sonic pulse reaching a sensing location at the sensing end of the waveguide is a measure of the distance to the variable position magnet from that location.

Such current pulses in the wire or guide in the relative translation distance measuring system are repeated frequently to provide a continual update of the position of the marker magnet, and so the distance thereto. The current pulse must be of a sufficient magnitude to generate the necessary magnetic field for interacting with the magnetic field of the varying position marker magnet so as to cause a sufficient torsion pulse to result therefrom in the waveguide at the marker position to form a traveling sonic pulse returning on that waveguide of a sufficient magnitude to be detected. A typical detection mechanism is to have the sonic pulse, or transmitted torsion pulse, move along magnetostrictive solenoidal cores that are attached to the waveguide and positioned in a magnetic coil to form a mode converter, thereby generating a voltage output corresponding to such sonic pulse induced motion.

Unfortunately, electrical noise due to various sources is also generated leading to many other pulses appearing in the voltage output over time, many of which have an amplitude less than that of the signal pulse induced by the torsion wave. Thus, these other pulses can be discriminated against on a magnitude basis to thereby select out only, or nearly only, those pulses due to the torsion waves. However, this situation is further complicated by the traveling sonic waves having magnitudes which decrease with distance along the sonic waveguide. Those which start further away will have a lower peak magnitude than those which are started closer to the mode converter. Thus, discrimination between electrical pulses at the output of the mode converter by magnitude can be difficult when done by a fixed magnitude threshold detector because of the difficulty in selecting a threshold value that would be proper for electrical pulses converted from sonic waves based on torsion pulses which are generated near the mode converter versus those which are generated far from the mode converter.

In addition, this selection process is complicated still further by the desire to use the same pulse detector circuitry in various instruments since the waveguides will be much longer in some instruments than in others leading to the magnitudes of the electrical pulses varying even more in peak magnitudes at the mode converter because of the greater range of distances over which torsion pulses can be generated. Furthermore, the sensing arrangements in each such instrument will significantly in sensitivity to returning sonic pulses in the same conditions even with the same pulse detection circuitry being used in instruments. Finally, the magnetostrictive constants of the magnetic materials used in the waveguide and the converter will vary significantly with temperature thereby also causing significant differences in pulse magnitudes. Thus, there is a desire for a signal pulse detection system which can detect signal pulses having peak amplitudes which substantially vary over time in the presence of noise.

SUMMARY OF THE INVENTION

The present invention provides a pulse detection system for detecting pulses in an electrical signal of sufficient magnitudes where such pulses exhibit varying peak magnitudes, the system having a control detector capable of having an output signal containing crossing indications of those corresponding signal pulses in the system input signal which have portions selected by signals applied to a control input thereof that go beyond a first threshold value of a selectable magnitude. A stored threshold crossing adjustable actuator receives an output signal therefrom to provide an output signal in turn representing at least portions of selected crossing indications previously stored in the stored threshold crossing adjustable actuator but reduced in magnitude in accord with signals occurring on an input of a controlled adjuster therein. A magnitude reduction controller connected to that controlled adjuster input directs the controlled adjuster to reduce the stored threshold crossing adjustable actuator output signal magnitude over time. An output detector, also connected to receive the system input signal, detects signals going beyond a second threshold value of a selected magnitude to provide the system output signal.

The stored threshold crossing adjustable actuator and magnitude reduction controller can be provided by a triggered pulse generator, a time integrator, and an integrator output reduction arrangement. Alternatively, the stored threshold crossing adjustable actuator and the magnitude reduction controller can be provided by a microcontroller.

BRIEF DESCRIPTION OF THE DRAWINGS

FIGS. 6, 6A, 6B, 6C and 6D show a flow chart for the operation of the system of FIG. 5.

DETAILED DESCRIPTION OF THE PREFERRED EMBODIMENTS

Figure 1:
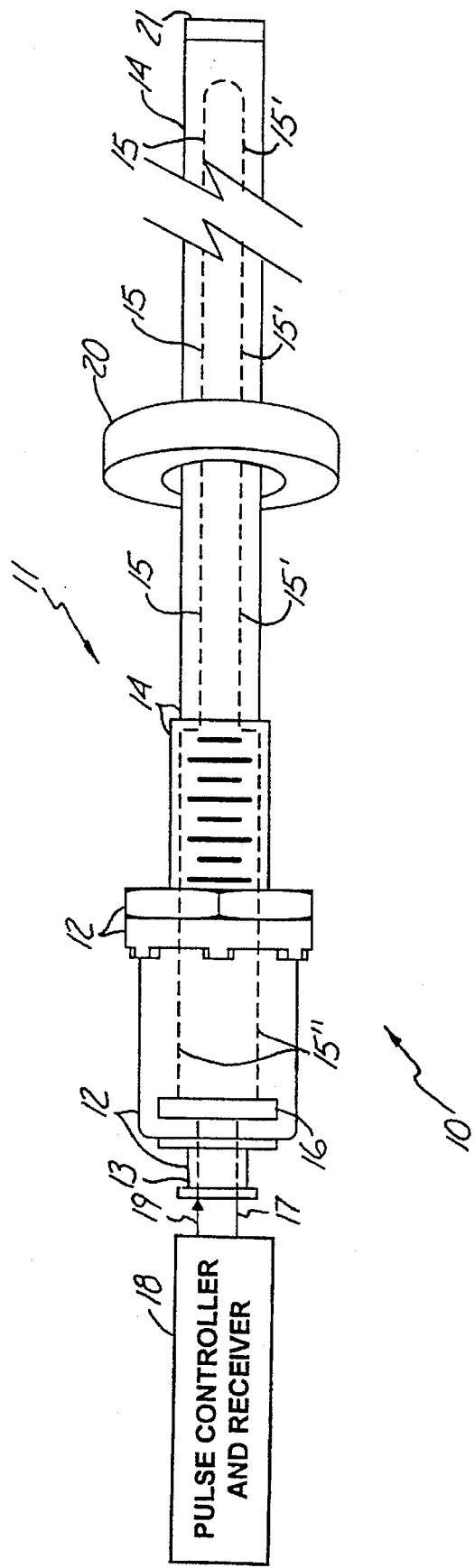
FIG. 1 shows a block diagram of a system embodying the present invention.

FIG. 1 shows in block diagram form a system or instrument, 10, for relative translation distance measurements based on a sonic waveguide. A transducer portion, 11, of system 10 includes an interface housing 12 containing mechanical arrangements and portions of the electronic circuits used for placing electrical current pulses on the sonic waveguide, and for obtaining indications of returns of the corresponding torsion pulses initiated on that sonic waveguide. An electrical terminal arrangement or connector, 13, provides for various electrical terminals being available exterior to housing 12 to electrically connect the electronic circuits in housing 12 to other electronic circuits portions in the system used to manage the operations occurring in transducer 11, and for extracting the desired information from results of such operations.

An outer enclosure, 14, is used to enclose a sonic waveguide, 15, that is represented by one side of a long dashed-line loop shown extending through nearly all of enclosure 14 in FIG. 1 and into housing 12 of transducer 11. Enclosure 14 has a threaded portion on the end thereof at which housing 12 is provided, this threaded portion being used in mounting instrument 10 to external support structure during use.

Thus, sonic waveguide 15 is shown in highly representational form in FIG. 1 extending from somewhere in housing 12 to near the opposite end of enclosure 14 and, in practice, is typically in the form of a long rod-like structure of an electrically conductive and ferromagnetic material in the form described here, although it could be formed as a ferromagnetic tube in the alternative mentioned above having an electrical conductor positioned therein. A complete electrical circuit to carry electrical current pulses through sonic waveguide 15 is required, and so in return electrical conductor or wire, 15', is provided which also extends from somewhere in housing 12 to near the opposite end of enclosure 14 at which end it is electrically connected to the end of the rods serving as sonic waveguide 15. Return conductor 15' is also represented by a long dashed-line in FIG. 1 as the other side of the long dashed-line loop shown in enclosure 14.

Sonic waveguide 15 is mounted within housing 12, and has attached thereto magnetostrictive appendages which convert the returning torsion pulses to magnetic flux pulses which can be sensed in a mode converter to provide an output signal representing those pulses. In addition, of course, there must be an electrical connection to the waveguide rod in housing 12 to permit current pulses to be introduced thereon. None of the circuitry including the sensing arrangements is indicated in the structure shown in FIG. 1, but a general representation of the interconnections are given by the remainder of the long dashed-line extending from sonic waveguide 15 and return conductor 15' that appear in housing 12, and these are designated 15". These represent interconnections between both the sonic waveguide and the sonic waveguide torsion pulse sensing circuits mentioned above, on the one had, and a printed circuit board, 16, on the other hand. Additional connections are also provided from printed circuit board 16 to the terminals provided for external connections through connector 13.

Signals containing information as to the return on sonic waveguide 15 of sonic wave pulses are provided on an interconnection arrangement, 17, extending from connector 13 to a pulse controller and torsion pulse signal receiver, 18, serving as the controller arrangement for operating system 10. In addition, current pulses introduced on sonic waveguide 15 to lead to such return torsion pulse signals are controlled through an interconnection arrangement, 19, extending from pulse controller and receiver 18 to connector 13. Typically, pulse controller and receiver 18 will be operated under the control of a microcomputer or microcontroller provided therein, although other control arrangements are possible. Even though FIG. 1 shows pulse controller and receiver 18 as a subsystem external to transducer 11, this need not be the actual arrangement in practice. That is, all or portions of this subsystem can be provided within housing 12 if so desired. On the other hand, because of the external connections made available through connector 13, this subsystem need not be provided in housing 12 but can be provided at a location separated to some degree from transducer 11.

Also shown in FIG. 1 in connection with transducer 11 is a magnetic marker, 20, surrounding enclosure 14 in transducer 11 so as to be guided therealong by that enclosure. That is, marker 20 is free to move in the directions parallel to enclosure 14 during typical operation, but not to significantly move in other directions. Magnetic marker 20 can be configured in many ways depending on the arrangement in which relative translation distances to be measured, one possibility being having the maker formed as a float with a magnet therein so as to permit it to represent the surface of a liquid in a tank. Many other alternatives for marker 20 are possible in applying the system of FIG. 1 to measure relative translation distances in various settings. An end cap, 21, is used to close enclosure 14.

Figure 2:
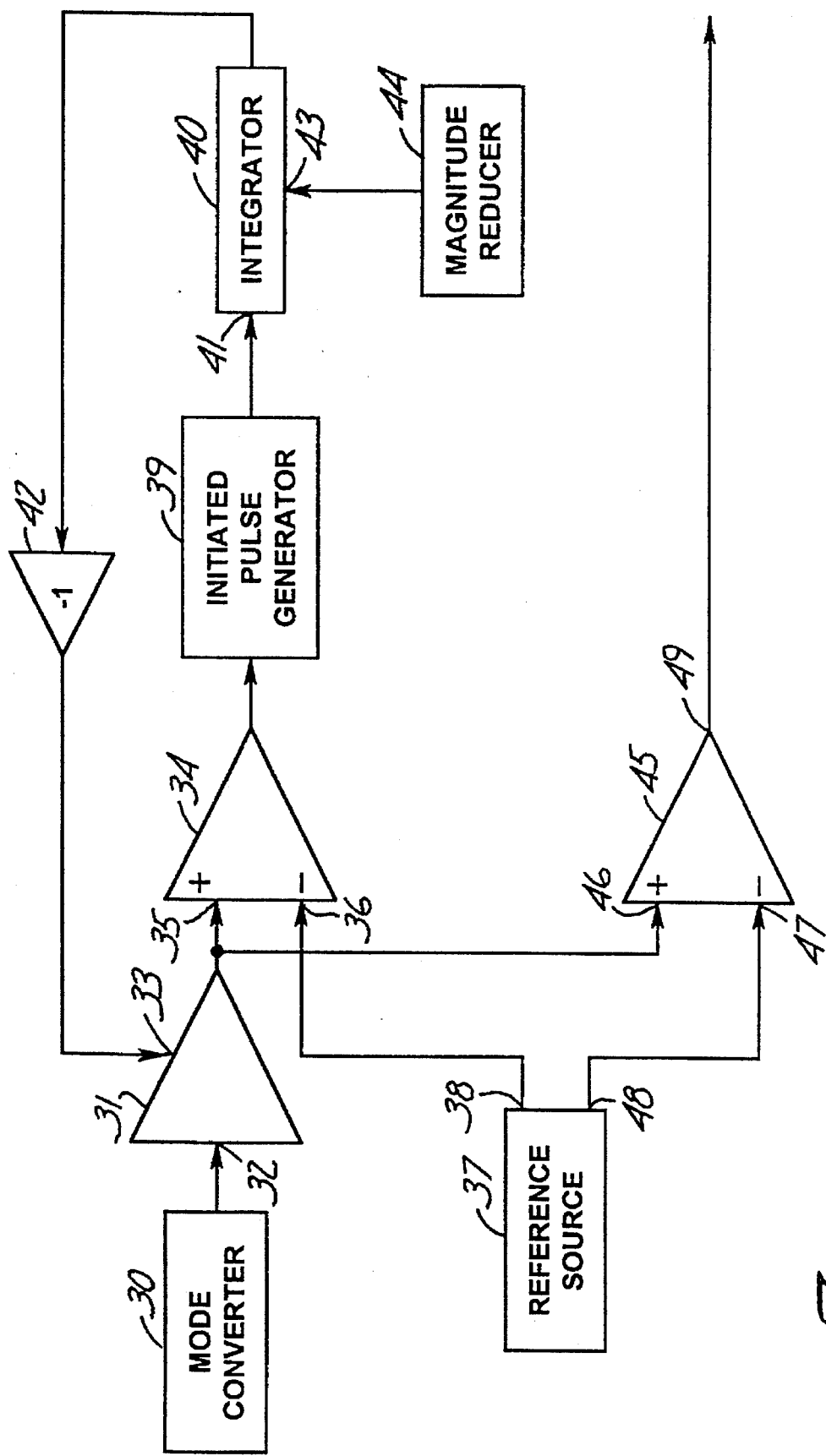
FIG. 2 shows a block diagram of a portion of the system of FIG. 1.

FIG. 2 shows a portion of the system of FIG. 1 in greater detail, this detail being presented in the form of a block diagram. This block diagram is one embodiment for part of the receiver portion of the system of FIG. 1 which receives electrical pulses from the mode converter based on the magnetic pulses generated therein in response to the returning sonic waves generated by torsion pulses on sonic waveguide 15 due to magnetic fields interactions. Thus, a mode converter, 30, as a part of pulse controller and receiver 18 is shown in FIG. 2 representing the structure provided for converting, into electrical voltage pulses, the returning sonic wave pulses on sonic waveguide 15 resulting from corresponding current pulses previously introduced on waveguide 15 by pulse controller and receiver 18 over interconnection arrangement 19 that have created magnetic fields which interacted with wave marker 20 at some location therealong. Hence, the output of mode converter 30 and transducer 11 during the operation of system 10 will be a succession of voltage pulses in time corresponding to the succession of corresponding current pulses in time initiated on sonic waveguide 15 by pulse controller and receiver 18. Such electrical pulses from mode converter 30 are transmitted over interconnection arrangement 17 to pulse controller and receiver 18 in the arrangement shown in FIG. 1 although, as previously indicated, pulse controller and receiver 18 could be provided in housing 12 of transducer 11.

Electrical voltage pulses in the output signal of mode converter 30 are subject to having peak magnitudes which vary considerably with the position of magnetic marker 20 along enclosure 14, the returning sonic wave pulses resulting from the torsion pulses generated by the interaction of the magnetic fields of the current pulse with the field of magnetic marker 20 at more remote locations along enclosure 14 generally being smaller in magnitude than those generated from nearer locations. This variation in the peak magnitudes of the electrical voltage pulses provided by the output of mode converter 30 is further increased in range by the use of sonic waveguides of varying lengths in transducer 11 to accommodate the differing distance measurement environments. Thus, a longer version of sonic waveguide 15 will be used in a deep tank for measuring the liquid level, based on magnetic marker 20 being formed as a float, then will be used in the situation of a relatively shallower tank. In addition as indicated above, electrical noise inevitably appears in the output signals from mode converter 30 to complicate its output voltage signal waveform. Thus, the receiver system portion in pulse controller and receiver 18 must discriminate between electrical noise pulses and those pulses in the output signal of mode converter 30 due to returning sonic wave pulses, and this is done on the basis of the peak magnitudes of the electrical voltage pulses corresponding to the returning sonic wave pulses being larger than those of the various electrical noise pulses.

Discriminating between the electrical voltage pulses based on return sonic wave pulses and electrical noise pulses on a magnitude basis requires the setting of a threshold value such that mode converter output voltage pulses with peak magnitude portions above the threshold value are taken to be electrical voltage pulses based on returned sonic wave pulses, and mode converter output voltage pulses with peak magnitudes less than the threshold value are taken to be electrical noise pulses or other unwanted pulses in the mode converter output signal. The selection of the threshold value that is optimal for making such pulse peak magnitude distinctions is difficult when the desired torsion wave pulse based electrical pulses have peak magnitudes which vary substantially as has been described. Desirably, the threshold should be set to a value which will be comfortably exceeded by the expected peak magnitudes of the sonic wave based electrical voltage pulses at any given time to assure that such pulses are detected, but this threshold should also be set to a value as far above the peak magnitudes of the unwanted other voltage pulses in the mode converter output signal as possible.

Such threshold value selection can be repeatedly done so that the threshold value is adapted to the currently experienced voltage signal pulse magnitude situation. Such adaptive setting can be accomplished by either (a) selecting a fixed value for the threshold and varying the currently set degree of amplification of the mode converter output signals, prior to the magnitudes thereof being compared to that threshold, varying this amplification to the point that the peak magnitudes of the desired electrical pulses are set to currently average some value in excess of the fixed threshold value, or (b) fixing the gain used for the mode converter output signals and varying the currently set threshold values, varying these threshold values to the point that the peak magnitudes of the desired electrical pulses currently average some value greater then the current threshold value. Thus, arranging the detector threshold value to be within a certain fraction of the current average value of the magnitude peaks of the sonic wave based electrical voltage pulses in the output signal of mode converter 30 is a dynamic process in view of the changing average magnitude of the peaks of the sonic wave based electrical voltage pulses occurring in that output signal.

An effective way of implementing this process is to use the detection experience of the sonic wave based electrical pulse detection system during gain or threshold value optimum seeking operations in an adjusting system, companion to that detection system, through causing the adjusting system to regularly either increase or decrease its sensitivity to magnitudes of the same mode converter output signal pulse peaks over time supplied to the detection system. In a situation of regularly decreasing this sensitivity, for instance, each mode converter output signal electrical voltage pulse currently occurring that goes beyond the currently set adjusting system detection threshold value is used by the adjusting system to reset the adjusting system detection threshold to a higher value, or the gain applied to the mode converter output signal to a smaller value (for a fixed adjusting system detection threshold value), to thereby decrease the adjusting system detection sensitivity.

This action is then followed by repeating this behavior until the coming of a mode converter output signal electrical voltage pulse which does not go beyond the currently set threshold. Such an occurrence results in the adjusting system thereafter increasing the adjusting system detection sensitivity by resetting the adjusting system detection threshold to a lower value, or the output signal gain to a greater value (for a fixed threshold value), which is repeated until the coming of a mode converter output signal electrical voltage pulse which again goes beyond the currently set threshold. As a result, the pulse detection system, through having its threshold value related to the currently set (or fixed) adjusting system threshold value, will always be operated in a region near the desired sensitivity for the currently experienced peak magnitude conditions of the pulses occurring in the output voltage signal of mode converter 30 based on the corresponding returned sonic wave pulses.

This seeking operation is accomplished in the receiver pulse detection system of pulse controller and receiver 18 shown in FIG. 2 by providing the output electrical voltage signal of mode converter 30 to a variable gain amplifier, 31, at a signal input thereof, 32. Variable gain amplifier 31 has the magnitude of the gain between its signal input and its output controlled at a gain control input, 33, and exhibits a sufficient gain range under this control to have the peaks in the output signals provided at the signal output thereof corresponding to the sonic wave based electrical pulses at its input with magnitudes exceeding a selected value no matter how far magnetic marker 20 is along waveguide enclosure 14 from housing 12. In addition, the bandwidth of variable gain amplifier 31 is sufficiently wide and the phase sufficiently linear to avoid undue distortion of the sonic wave based electrical pulses in the output signal of mode converter 30 supplied thereto.

The output signal of variable gain amplifier 31 is provided to a comparator, 34, at a signal input thereof, 35. The magnitudes of the signals applied to signal input 35 of comparator 34 are compared against a reference signal supplied at a reference input, 36, of comparator 34 from a reference source, 37, at a first output thereof, 38. Whenever the magnitude value of the output signal of variable gain amplifier 33 that is applied to signal input 35 of comparator 34 has a first magnitude relationship with the magnitude of the reference signal applied at reference input 36 of comparator 34 (either greater of smaller), the output of comparator 34 is at one logic state voltage value. In the other situation where the magnitude of the signal at signal input 35 of comparator 34 has the opposite magnitude relationship with reference signal 36, the output of comparator 34 is at the opposite logic state voltage value.

For purposes of this description, the higher logic state voltage value at the output of comparator 34 occurs when the magnitude of a torsion wave based electrical pulse in the output signal of mode converter 30, after amplification in variable gain amplifier 31, is sufficient to exceed the reference signal at output 38 of reference source 37. The output signal of comparator 34 will be applied to the input of an initiated pulse generator, 39, to, in one logic state, trigger a pulse of a selected duration and magnitude at the output of that generator, but to not do so in the other possible logic state. Here, each such output pulse from pulse generator 39 corresponds to a high logic state voltage value having occurred in the output of signal of comparator 34. Initiated pulse generator 39 can be implemented using a monostable multivibrator or "one shot" pulse generator.

The uniform pulses of selected duration and magnitude supplied by initiated pulse generator 39 of the output thereof are applied to an integrator, 40, at a signal input thereof, 41. There, the applied uniform pulses are integrated over time by integrator 40 and the result applied by the output of integrator 40 through a signal polarity invertor, 42, to control input 33 of variable gain amplifier 31 to select the gain therefor. Integrator 40 can be implemented in essence by the use of any of several well known, commercially available operational amplifiers together with a capacitor connected between the output and an inverting signal input thereof to form an integrator performing time integration of the input signals provided thereto.

However, integrator 40 also has a magnitude reduction input, 43, at which is connected to the output of an output signal magnitude reducer, 44, which is used to regularly reduce the magnitude of the integrator output signal over time at a selected rate or rates. A zero value output signal at the output of integrator 40 results in variable gain amplifier 31 having its maximum gain which will decrease as the value of the output signal of integrator 40 increases through integrating over time the uniform pulses supplied to its signal input by pulse generator 39 from its output. Magnitude reducer 44, on the other hand, by reducing the magnitude of the output signal of integrator 40 acts to increase the gain of variable gain amplifier 31.

Magnitude reducer 44 can be implemented by placing a resistor between the output of integrator 40 and its virtual ground if implemented using an operational amplifier as described above. Alternatively, magnitude reducer 44 can be formed as a reference voltage source with a constant output voltage signal of a polarity opposite that of the uniform pulses supplied by pulse generator 39 which reference source signal can be provided to a second signal input of integrator 40 to be additively combined by integrator 40 with the output signal from generator 39.

Thus, in the absence of sonic wave based electrical pulses from mode converter 30 of a sufficient magnitude to cause comparator 34 to reach its high logic state voltage to initiate pulses from pulse generator 39, magnitude reducer 44 will force integrator 40 to reduce its output signal thus raising the gain of variable gain amplifier 31. When that gain has become sufficient so that sonic wave based electrical pulses from mode converter 30 have the magnitude to cause comparator 34 to switch to its high voltage logic state to initiate uniform output pulses from pulse generator 39 in its output signal to integrator 40, the magnitude of the output signal of integrator 40 will increase to force the gain of variable gain amplifier 31 back to a lower value. As a result, the gain of variable gain amplifier 31 is varied in a repeating cycle to repeatedly reach that value necessary to cause output pulses therefrom to force the output of comparator 34 into its high logic state voltage value to initiate uniform pulses from pulse generator 39 to integrator 40, and thereafter receding to a sufficiently low value so as to prevent such uniform pulses from being supplied to integrator 40 from pulse generator 39.

As a result, the gain of variable gain amplifier 31 is repeatedly being adjusted to be sufficient to permit the magnitudes of peaks of concurrent torsion wave based electrical pulses in the output signal of mode converter 30 after amplification to be sufficient to force the output of comparator 34 from its low logic state value to its high logic state value. The rate at which this is repeated will depend on the rate at which current pulses are launched in sonic waveguide 15 to result in return torsion waves to mode converter 30, the duration and magnitude of the uniform pulses supplied by pulse generator 39, the integration rate of integrator 40 and the output signal reduction rate of magnitude reducer 44.

A further comparator, 45, similar to comparator 34 has its signal input, 46, connected also to the output of variable gain amplifier 31. A reference input, 47, of comparator 45 is connected to another output, 48, of reference source, 37, which provides a further reference signal of a smaller magnitude than that of the reference signal provided in output 38 thereof, in fact, the signal at output 38 has a magnitude that is a fixed fraction of that at output 38. This in effect provides a lower threshold value for comparator 45 than that which is provided for comparator 34. Such a lower magnitude threshold value assures that sonic wave based electrical pulses in the output signal of mode converter 30, after amplification by variable gain amplifier 31 using the currently set gain value therefor, will have magnitudes clearly sufficient to force comparator 45 to switch logic states at its output even though not always sufficient to force comparator 34 to do so during the operation for seeking the optimal gain for variable gain amplifier 31 as described above. The fractional decrease in reference signal values from output 38 to output 48 needs to be less than the fractional change in the gain of variable gain amplifier 31 in its optimal gain seeking operation cycle.

The output of signal comparator 45 is taken as the pulse detection system output, 49, indicating when an electrical voltage pulse from mode converter 30 has been detected as having a sufficient peak amplitude to be considered as a sonic wave based pulse. Alternatively, comparator 45 could be eliminated and the system output taken as the output of comparator 34 if the subsequent signal processing circuitry connected to the pulse detection system output can be operated satisfactorily even though it does not receive from the detection system some output pulses corresponding to the detection system input pulses provided by the mode converter output signal electrical voltage pulses.

Figure 3:
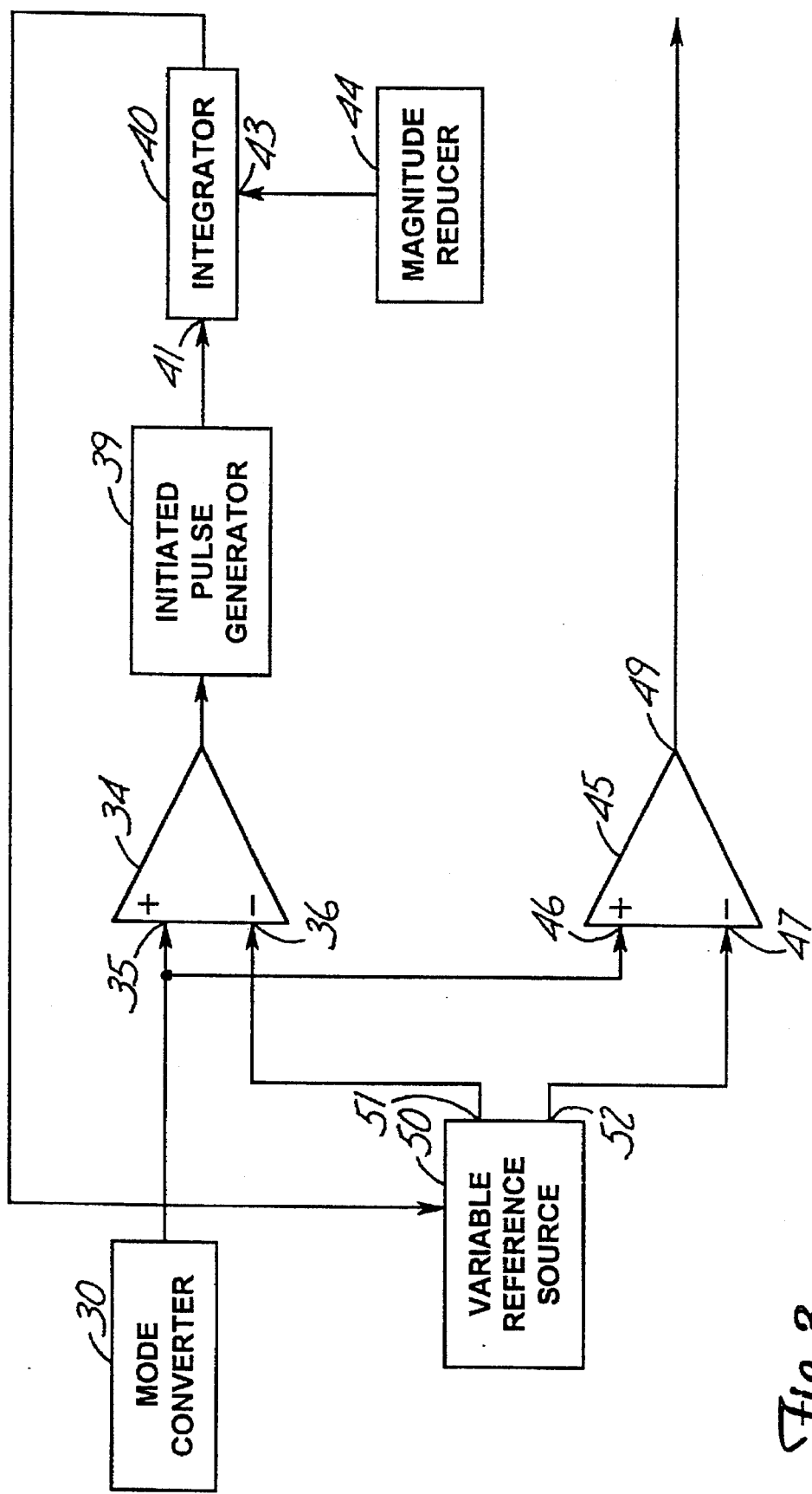
FIG. 3 shows an alternative block diagram of that portion of the system of FIG. 1.

FIG. 3 shows an alternative embodiment for the receiver pulse detection system also shown in block diagram form. Here, variable gain amplifier 31 of FIG. 2 has been omitted so that the output of mode converter 30 in FIG. 3 is connected directly to signal input 35 of comparator 34. Rather than varying the magnitude of the output signals of mode converter 30, the reference value of comparator 34 is varied to thereby vary the threshold value which must be exceeded by some portions of the sonic wave based pulse waveforms in that signal around the peak magnitudes thereof to force the output of comparator 34 into its high logic state.

Thus, a variable output voltage reference source, 50, is provided having a first reference voltage output, 51, connected to reference input 36 of comparator 34. A second reference voltage output, 52, is connected to reference input 47 of comparator 45. Again, the voltage supplied at reference voltage output 52 is a selected fraction of that supplied at reference voltage output 51. Reference source 50 can be provided in arrangement simply as a resistive voltage divider in series with the output of integrator 40 with that output also connected to input 36 of comparator 34 and the divider output connected to input 47 of comparator 45. This fractional relationship between the threshold values for comparators 34 and 45 assures that sonic pulse wave based pulses in the output voltage signal of mode converter 30 that are of a magnitude close to those found just exceeding the currently set threshold value of comparator 34 during the operation setting that threshold value will have magnitudes sufficient to exceed the currently maintained threshold value of comparator 45 set as a fraction of that comparator 34 threshold value.

Figure 4:
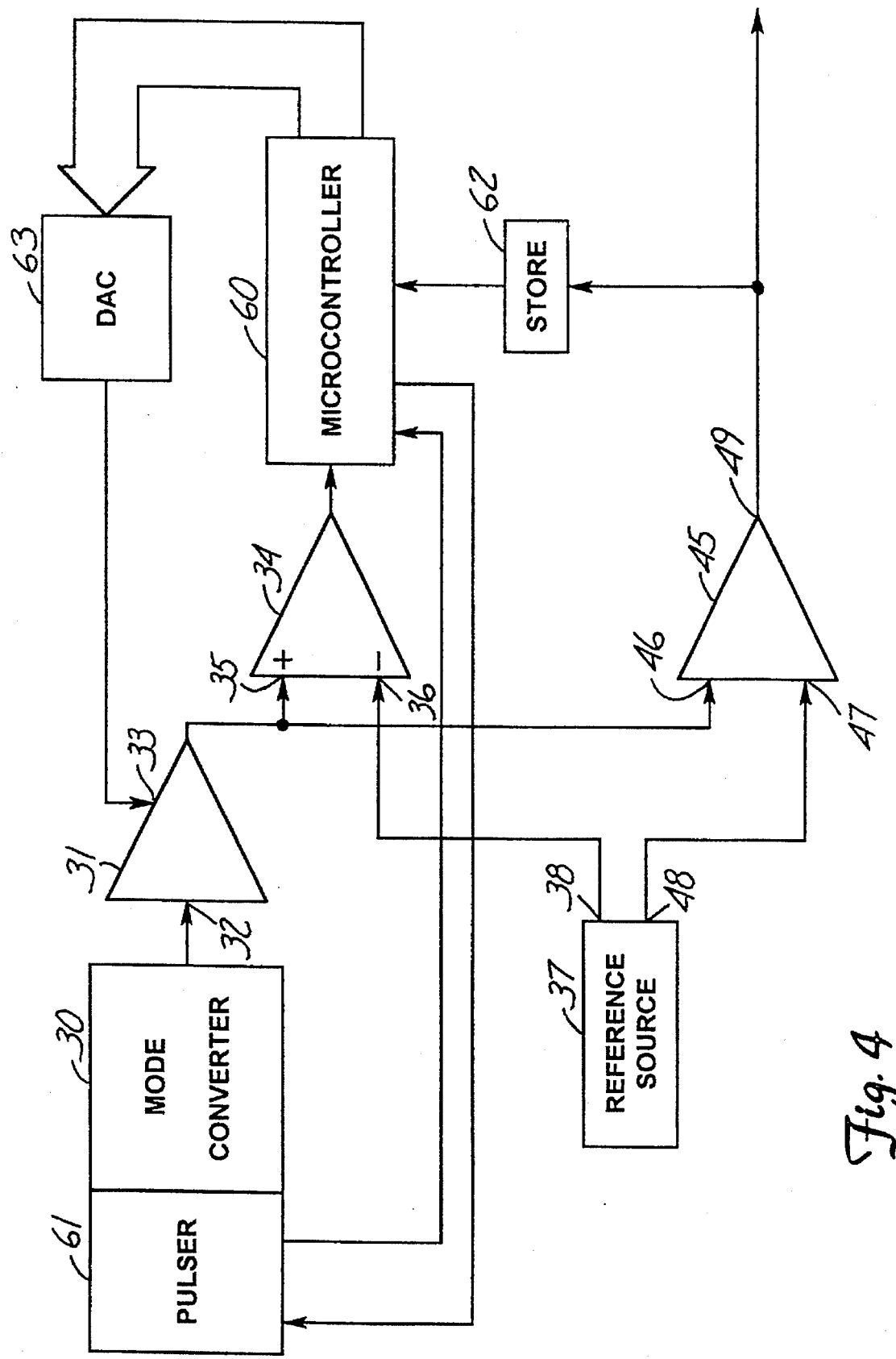
FIG. 4 shows an another alternative block diagram of that portion of the system of FIG. 1.
Figure 5:
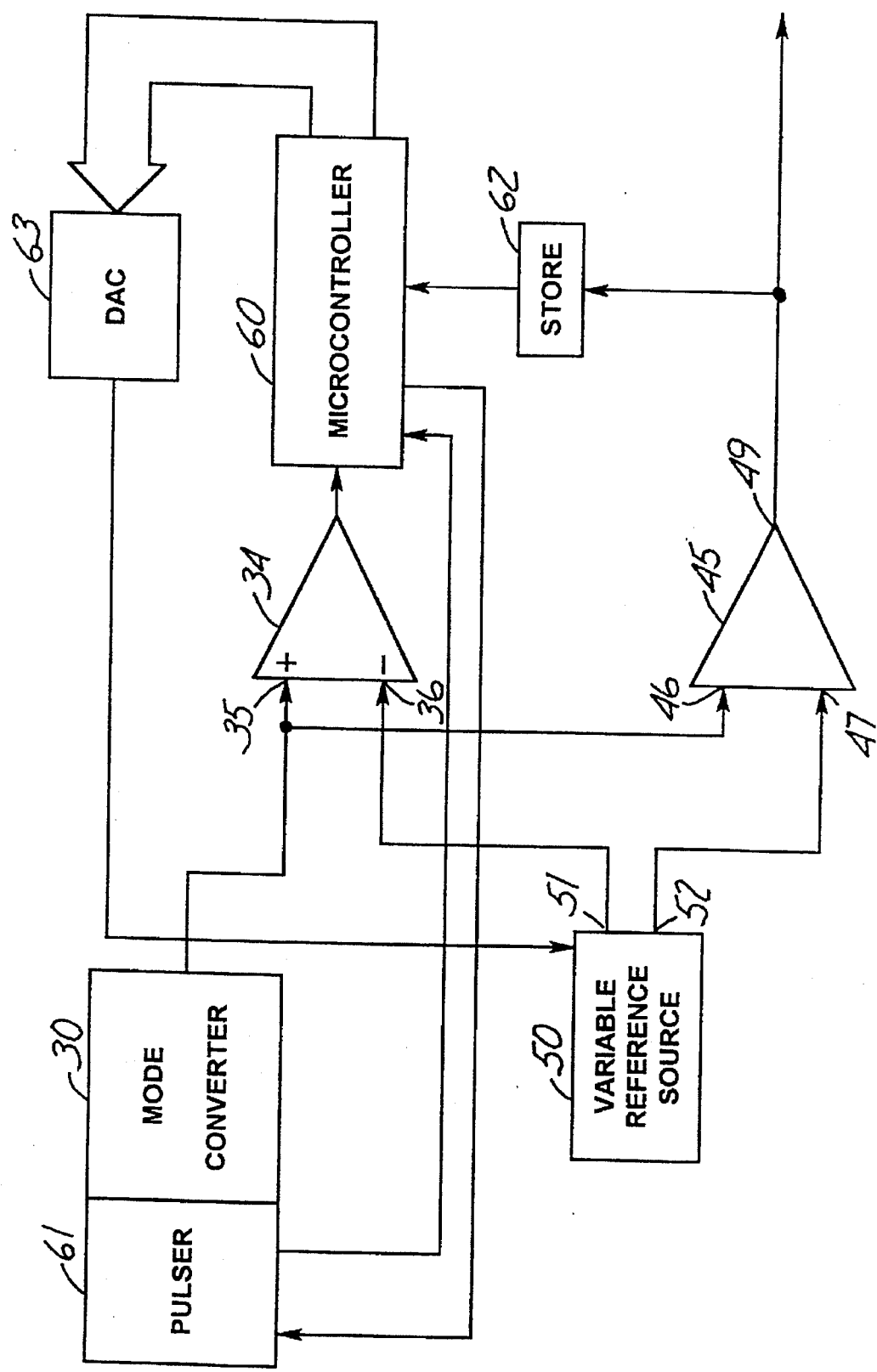
FIG. 5 shows a further alternative block diagram of that portion of the system of FIG. 1.

FIGS. 4 and 5 show further alternative embodiments for the receiver pulse detection systems shown in FIGS. 2 and 3, respectively, again showing them in block diagram form. The systems of FIGS. 4 and 5 each use a microcontroller, 60, such as a 87C51 microcontroller offered by Intel Corp. of Santa Clara, Calif., in place of initiated pulse generator 39, integrator 40 and magnitude reducer 44 in the systems of FIGS. 2 and 3 (and inverter 42 in FIG. 2), a microcontroller which can be the microcontroller in general use to operate pulse controller and receiver 18. Here, microcontroller 60 receives the threshold crossing indications in the output signal of loop comparator 34 corresponding to sonic wave based electrical voltage pulses in the output signal of mode converter 30 presented to input 35 of that comparator. In addition, microcontroller 60 receives indications of initiations of current pulses introduced on waveguide 15 by pulse controller and receiver 18 over interconnection arrangement 19, also under the direction of microcontroller 60, which lead to the occurrences of those sonic wave based voltage pulses.

Thus, in the system of FIG. 4, a current pulse generator or pulser, 61, is shown as a further part of pulse controller and receiver 18 in addition to mode converter 30 previously indicated to be a part thereof. Microcontroller 60, in operating the system of FIG. 4, directs pulser 61 to initiate current pulses on waveguide 15 leading to returning sonic wave pulses that are converted by mode converter 30 into pulses in an electrical voltage output signal provided therefrom to the signal input of variable gain amplifier 31. A suitable pulser is described in an earlier filed copending application by S. W. Smith entitled "Pulse Generator" having Ser. No. 08/497,210 which is hereby incorporated herein by reference, and which is assigned to the same assignee as the present application.

After amplification, a corresponding signal is supplied at the output of variable gain amplifier 31 to signal input 35 of loop comparator 34, the pulse detector for the adjusting feedback loop, which again has a fixed value supplied thereto at reference input 36 thereof to establish a threshold therein by output 38 of reference source 37. The output signal variable gain amplifier 31 is also supplied to signal input 46 of comparator 45, the pulse detector for the main signal processing system, which again also has a fixed reference value supplied to reference input 47 thereof to establish a threshold therein by output 48 of reference source 37. This fixed threshold value supplied by reference source 37 to system comparator 45 is again a fraction of that fixed threshold value supplied by source 37 to input 36 of loop comparator 34.

The output signal of loop comparator 34, having the indications therein of those mode converter output signal voltage pulses with peaks sufficient to cross the fixed threshold value, is supplied to an input of microcontroller 60. Microcontroller 60 awaits the reception of such an indication using an interrupt routine therein following indications supplied by pulser 61 to microcontroller 60 that an interrogation current pulse has been initiated by pulser 61 on waveguide 15. The output signal of comparator 45 also contains indications of those of mode converter output pulses having peaks crossing the fixed threshold thereof.

These indications are transmitted to the signal processing circuitry subsequent to the system pulse detector, but are also provided to a memory store, 62, to thereby keep a record of the occurrence of such threshold crossings. The contents of store 62 can be retrieved by microcontroller 60 as needed to ascertain that a sonic wave pulse return leading to a corresponding mode converter output signal electrical voltage pulse was detected by the system pulse detector, that is, comparator 45, for the corresponding initiation of a current pulse by pulser 61 on waveguide 15.

Current pulses initiated by pulser 61 on waveguide 15 which do not result in a sonic wave pulse returning with sufficient energy to generate a voltage pulse in the output signal of mode converter 30 after amplification by variable gain amplifier 31 to go beyond the threshold of loop comparator 34 leads microcontroller 60 to direct an increase in the gain of variable gain amplifier 31. Microcontroller 60 does this by generating a new gain value it provides in digital form at an output thereof which is transmitted to a digital-to-analog converter, 63. Converter 63 in turn provides a corresponding analog signal at the output thereof connected to the control input of variable gain 31 to cause such a gain adjustment. If, on the other hand, the corresponding voltage peak in the output signal for mode converter 30 after amplification by variable gain amplifier 31 is sufficient to go beyond the threshold set in loop comparator 34, microcontroller 60 will direct a reduction in the gain of amplifier 31 through converter 63 until a peak in the output signal of mode converter 30 is reached that does not go beyond the threshold set in loop comparator 34 after amplification by variable gain amplifier 31, and then begin again increasing the gain.

The operation of the system of FIG. 4 will be further revealed in connection with the description of the operation of the system of FIG. 5 which will be set forth in greater detail. The system of FIG. 5, of course, uses variable reference source 50 rather than fixed reference source 37 of FIG. 4, and omits variable gain amplifier 31 of FIG. 4. Nonetheless, the operation of the remaining portions of the system of FIG. 5 are similar to the operations of the remaining portions of FIG. 4. The description of FIG. 5 will assume that negative peaks in the electrical voltage output signal of mode converter 30 are to be detected in the pulse detection system. The operation of the system of FIG. 5 is indicated in the flowchart of FIGS. 6, 6A, 6B, 6C and 6D with FIG. 6 showing how the remaining flow chart portions in FIGS. 6A, 6B, 6C and 6D are assembled for use.

Figure 6:
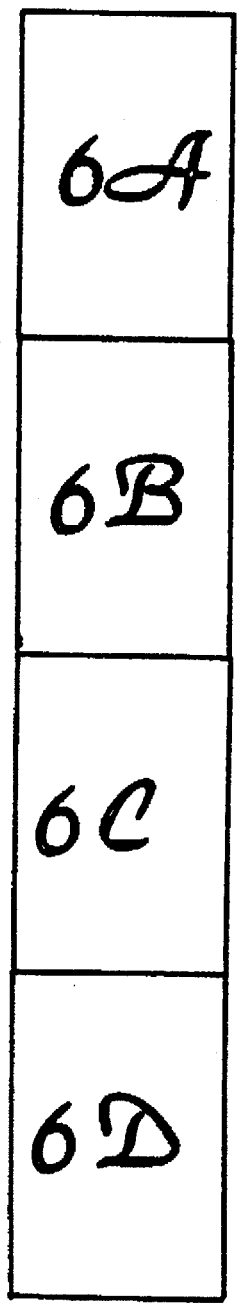
Figure 6A:
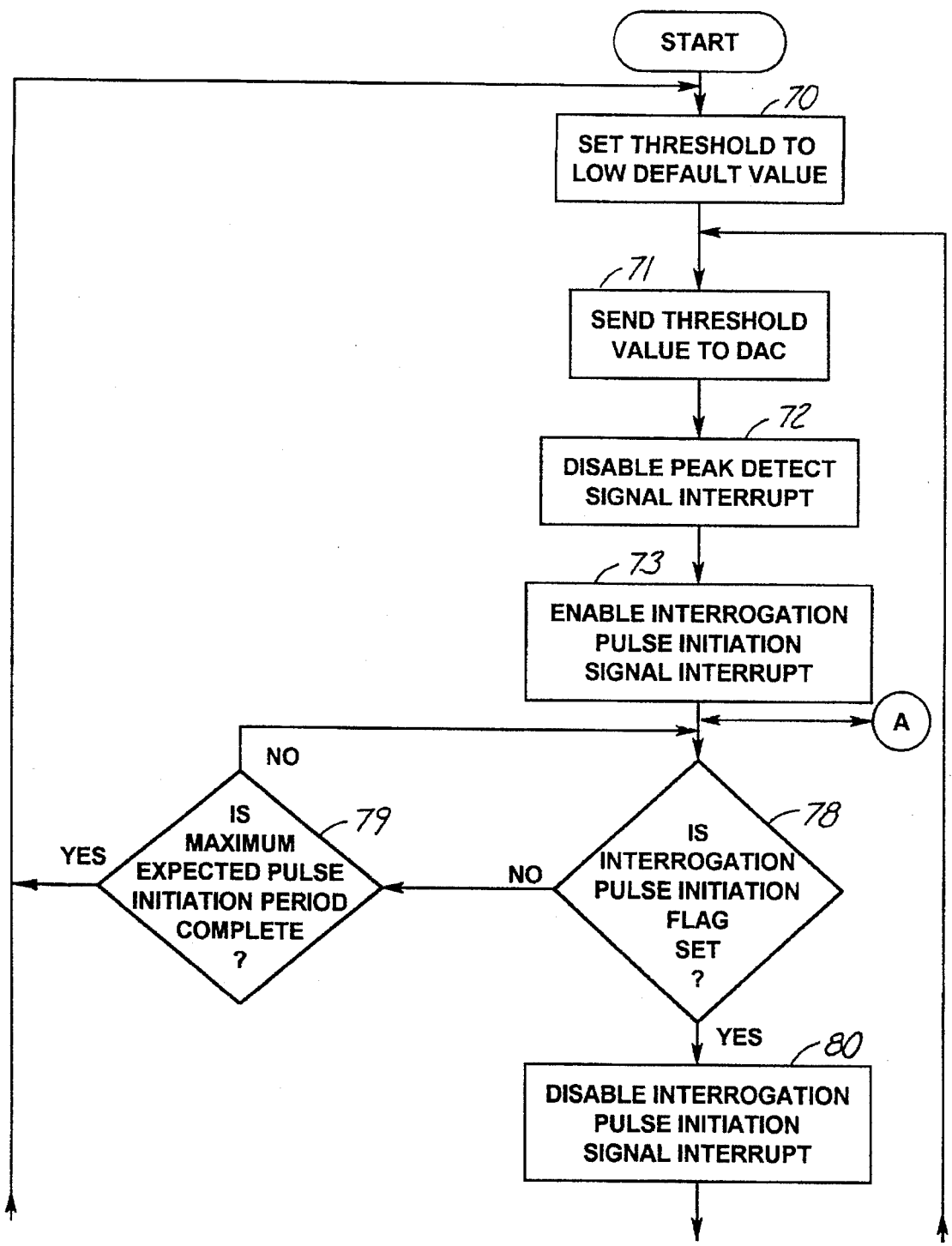

Turning to that flowchart and beginning at the "start" balloon located at the top in FIG. 6A, a first action block, 70, sets out the initial system operation step as microcontroller 60 selecting a relatively low default value for the threshold being set by variable reference source 50 for loop comparator 34 and, therefore, for system comparator 45. This default value for the threshold for loop comparator 34 needs to be sufficiently low so that system comparator 45 is assured of detecting a sonic wave based electrical voltage pulse in the output signal of mode converter 30 in response to a current pulse being initiated by pulser 61 on waveguide 15. Once that default value has been selected as the initial threshold value for output 51 of source 50, a further block, 71, indicates that microcontroller 60 sends this value to converter 63 which in turn causes variable reference source 50 to provide the selected threshold value at output 51 thereof for reference input 36 of loop comparator 34, and results in a corresponding value occurring at output 52 of variable reference source 50 for reference input 47 of system comparator 45.

Once this threshold setting is accomplished, microcontroller 60 disables the peak detect signal interrupt as indicated in a further block, 72, in FIG. 6 to prevent any of the accompanying transients due to the current pulse being initiated by pulser 61 from being detected by either of comparators 34 or 45 as an input signal peak. This interrupt will be later used in connection with the detection by loop comparator 34 of the corresponding mode converter output signal electrical voltage pulse.

Thereafter, microcontroller 60 enables the interrogation pulse initiation signal interrupt as indicated in the following block, 73, to permit microcontroller 60 to be informed of the initiation of the current pulse on waveguide 15 by pulser 61. The corresponding interrupt routine shown in FIG. 6D is then entered at the "A" balloon indicating the start of the interrupt service to be at a first block, 74. Pulser 61 sends a signal to microcontroller 60 as a basis for microcontroller 60 detecting that interrogation current pulse has been initiated by pulser 61 on waveguide 15 as indicated in the following block, 75. A detection of the initiation of a current interrogation pulse by pulser 61 for the purpose of finding the current location of marker 20 along housing 14 results in setting the interrogation pulse initiation flag in corresponding register of microcontroller 60 as indicated in the next block, 76, of the "A" subroutine. The system operation process after this flag setting continues in microcontroller 60 if the initiation pulse indication has been detected as indicated by a return block, 77, at the end of the "A" interrupt service routine once microcontroller 60 detects the interrogation pulse initiation flag. If this flag is not detected within a set time duration, microcontroller 60 restarts the process by again setting the default value for the loop comparator 34 threshold.

Thus, returning to FIG. 6A, microcontroller 60 checks the interrogation pulse initiation flag register for the setting of the interrogation pulse initiation flag as indicated in a decision diamond, 78. If that flag has not yet been set, microcontroller 60 checks to see whether the maximum expected time for such a setting to occur has elapsed in a further decision diamond, 79. If so, microcontroller 60 restarts the operation process as seen by the arrow leading from decision diamond 79 upward to just below the start balloon. If, however, the maximum time expected for setting the interrogation pulse initiation flag has not yet elapsed, indicating that there is still time permitted to detect the returning sonic wave pulse based on the interrogation current pulse initiated by pulser 61 and waveguide 15, microcontroller 60 continues to wait. Once detected, microcontroller 60 disables the interrogation pulse initiation signal interrupt as indicated in a further block, 80, in FIG. 6A. Further, microcontroller 60 goes on in FIG. 6B to reset the interrogation pulse initiation flag in the register therefor as set out in a first block, 81, in that figure.

Figure 6B:
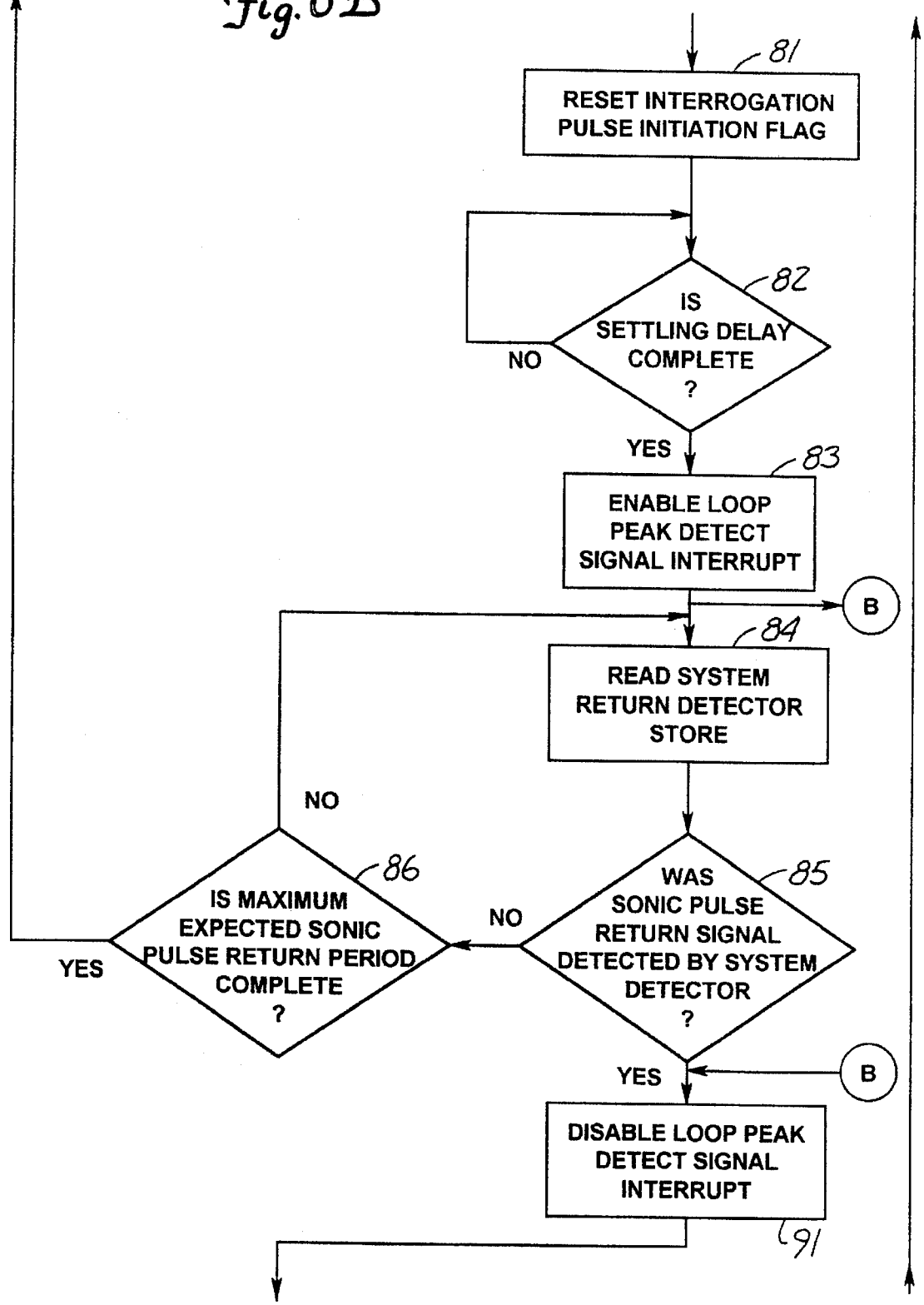

Microcontroller 60 in FIG. 6B then permits a settling delay to allow any transients in the system to subside that have resulted from the interrogation current pulse being initiated by pulser 61 on waveguide 15 as is indicated in a decision diamond, 82. This delay is indicated in connection with decision diamond 82 by a feedback arrow leading from its "no" decision output back to its input. Typically, a 20 μs time duration is allowed for such transient settling.

Once this settling delay is completed, microcontroller 60 enables the loop peak detect signal interrupt, as indicated in a subsequent block, 83, to permit microcontroller 60 to be informed of the detection of a negative voltage pulse in the electrical voltage output signal of mode converter 30 for that sonic wave pulse corresponding to the interrogation current pulse just previously initiated by pulser 61. The occurrence of such a corresponding negative voltage pulse in the output signal of mode converter 30 is first confirmed by microcontroller 60 in retrieving the contents of store 62 indicating that the negative voltage pulse in the output signal of mode converter 30 corresponding to the returning sonic wave pulse has occurred. This occurrence is detected through a magnitude of that pulse having gone beyond the threshold (here, below the threshold in this negative voltage pulse and negative threshold value example) of system comparator 45 as indicated in the next block, 84, a threshold of a smaller magnitude than that of loop comparator 34 as stated above.

The consequence of microcontroller 60 obtaining the corresponding contents of store 62 is determined in a decision diamond, 85, based on a determination of whether the sonic pulse return signal was detected by comparator 45. If not, a further determination is made as to whether the expected sonic pulse return period has been completed in a further decision diamond, 86, an expected pulse return period typically being 3.0 ms. If the expected pulse return period has elapsed without a mode converter 30 output signal negative pulse being detected corresponding to the return of the sonic pulse, the system is reset to start again as indicated by the arrow from decision diamond 86 leading upward to below the "start" balloon in FIG. 6A, such restarting recognizing that something is amiss in the system setup. If the expected return period is not yet complete, microcontroller 60 continues to monitor store 62 as indicated by the feedback path from decision diamond 86 to just ahead of block 84. This continues until either the expected return period has elapsed without the detection of a mode converter 30 output signal pulse corresponding to the expected sonic wave return pulse, this elapse leading to restarting the system as described above, or until such a sonic wave return based output signal pulse is detected by the system pulse detector, i.e. comparator 45.

Concurrently with the monitoring of the detection of the sonic pulse return signal by the system detector, the interrupt routine "B" is also entered to permit microcontroller 60 to receive an indication that loop detector 34 also detected that mode converter 30 output signal pulse. Thus, having confirmed that a sonic wave pulse returned that lead to a detected mode converter 30 output signal pulse, microcontroller 60 also determines whether the magnitude of this mode converter output signal pulse also went beyond the greater magnitude threshold of loop comparator 34.

This "B" interrupt routine is entered after the enabling of the loop peak detect signal interrupt in block 83 beginning with a start interrupt service block, 87, as shown in FIG. 6D. Microcontroller 60 awaits an indication from loop controller 34 that a sonic wave based mode converter output signal peak has occurred, and that this occurrence has been detected by loop comparator 34 in a further block, 88. Loop comparator 34 having detected such a mode converter output signal peak results in the setting of a loop peak detect flag in a register therefor in microcontroller 60 as indicated in a further block, 89. The system operation process after this flag setting continues in microcontroller 60 if a peak has been detected by system comparator 45 as indicated by a return block, 90, at the end of the "B" interrupt service routine and a return from that routine below decision diamond 85. If confirmation of a sonic wave return pulse is not detected within the expected return pulse time duration, microcontroller 60 restarts the process by again setting the default value for the loop comparator 34 threshold as described above.

If the system pulse detector, comparator 45, has detected a return pulse, microcontroller 60 continues by disabling the loop detect signal interrupt as indicated in a following box, 91, at the bottom of FIG. 6B. Microcontroller 60 then checks at the top of FIG. 6C to see whether the loop peak detect flag was set in a further decision diamond, 92, indicating that the negative pulse in the output signal of mode controller 30 went beyond the threshold (below the threshold in this negative pulse, negative threshold example) of loop comparator 34. If not, microcontroller 60 prepares a new value for the threshold of loop comparator 34 to be used in variable reference source 50 in a further block, 93, one having a lower magnitude value set by incrementing the negative value (make more positive) previously set by variable reference source 50 for that threshold. If, on the other hand, the negative pulse in the output signal of mode converter 30 has gone beyond the threshold value of loop comparator 34, microcontroller 60 prepares a new value for the magnitude of the threshold to be provided by variable reference source 50 for loop comparator 34 in a further block, 94, which is an increased magnitude value, that is, variable reference source 50 is to be directed to decrement (make more negative) the threshold value previously set therefor by variable reference source 50. After such incrementing or decrementing to form a new value for the threshold of loop comparator 34, microcontroller 60 resets the loop peak detection flag in a further block, 95.

After this determination of the new threshold value for loop comparator 34 has occurred, and thereby also a determination of a new threshold value for system comparator 45, microcontroller 60 checks on whether the newly set threshold value for loop comparator 34 is beyond the limits predetermined therefor. In a first decision diamond, 96, microcontroller 60 determines whether the new threshold value is above the upper limit predetermined therefor. If it is, microcontroller 60 directs that variable reference source 50 is to set the threshold value for loop comparator 34 equal to the upper limit value therefor in a box, 97, through having this limit value sent to converter 63 as indicated by the arrow leading from box 97 in FIG. 6C to just above box 71 in FIG. 6A to begin again the threshold adjustment cycle. If, on the other hand, the newly determined threshold value was not above the upper limit, microcontroller 60 determines in a further decision diamond, 98, whether the newly determined value is below the predetermined lower limit therefor. If it is, microcontroller 60 directs that variable reference source 50 is to set the threshold value for loop comparator 34 equal to the lower limit value therefor in another box, 99, through having this limit value sent to converter 63 as indicated by the arrow leading from box 99 in FIG. 6C to just above box 71 in FIG. 6A to restart the adjustment cycle.

Figure 6C:
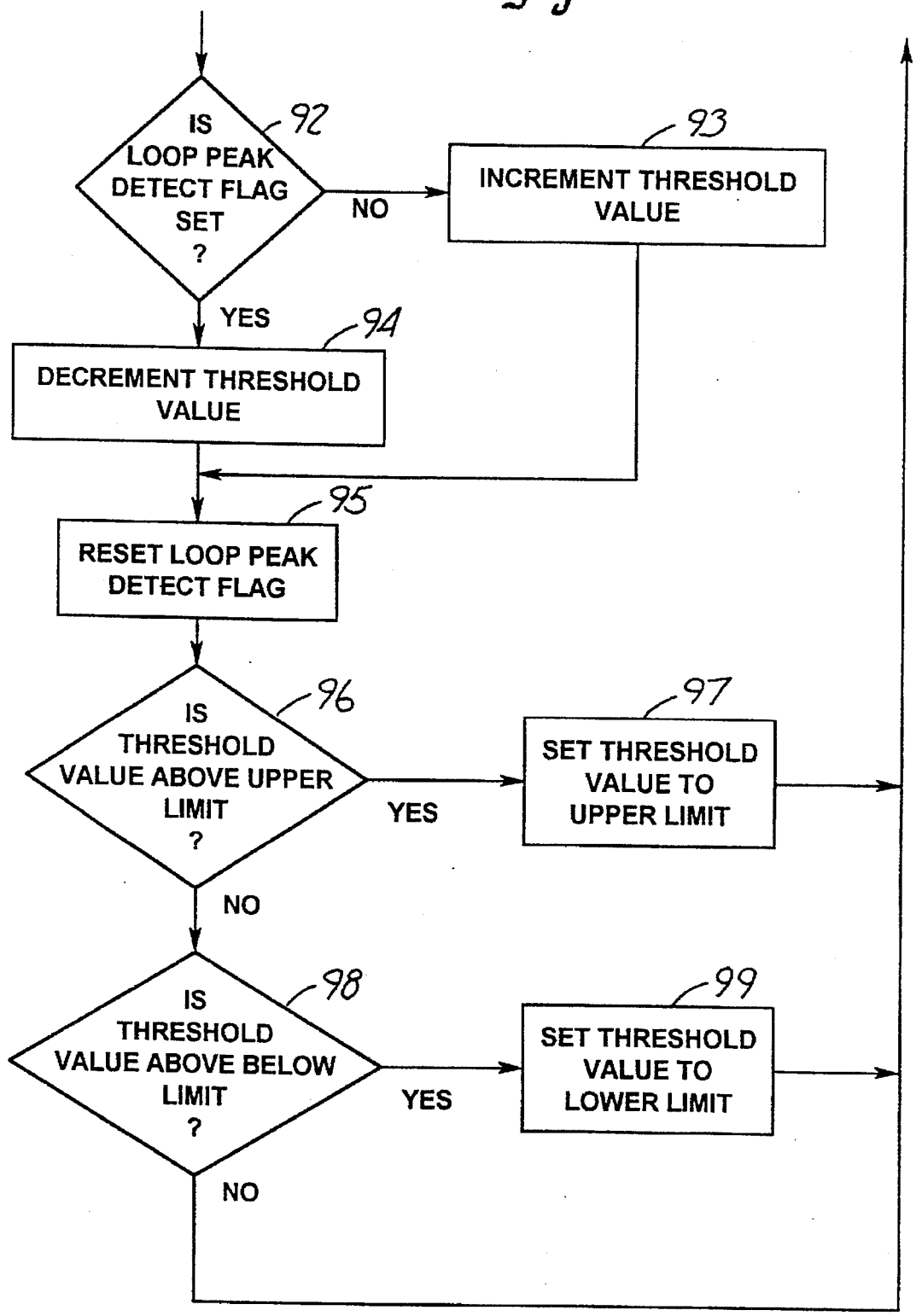

In the further possibility that the newly set threshold value is neither above the upper limit nor below the lower limit, microcontroller 60 directs that variable reference source 50 is to set the threshold value for loop comparator 34 equal to the newly determined threshold value occurring within the limits in decision diamond 98 through having this determined value sent to converter 63 as indicated by the arrow leading from decision diamond 98 in FIG. 6C to just above box 71 in FIG. 6A to repeat the adjustment cycle. Thus, microcontroller 60 continues operating the adjustment feedback loop through the process shown in FIG. 6 to regularly adjust the threshold provided by variable reference source 50 to be in accord with the magnitudes of the negative electrical voltage pulses occurring in the output signal from mode converter 30 corresponding to the returning sonic wave pulses based on the current pulses sent out by pulser 61.

Although the present invention has been described with reference to preferred embodiments, workers skilled in the art will recognize that changes may be made in form and detail without departing from the spirit and scope of the invention.

What is claimed is:

1. An adaptive signal magnitude detection system for detecting signal pulses having sufficient magnitudes occurring in input signals provided at an input thereof, said input signals containing successions of said signal pulses exhibiting varying peak magnitudes, said system comprising:

a control detector having a signal input coupled to said system input, a control input and an output, said control detector being capable of having an output signal provided at said output thereof having crossing indications therein of those corresponding said signal pulses in said system input signals which have pulse portions selected by signals applied to said control input going beyond a first threshold value of a selectable magnitude;

a stored threshold crossing adjustable actuator having an input coupled to said control detector output, an output coupled to said control detector control input, and a controlled adjuster input, said stored threshold crossing adjustable actuator being capable of having an output signal provided at said output thereof representing at least portions of selected said crossing indications in said control detector output signal previously stored in said stored threshold crossing adjustable actuator but changed in magnitude to the extent in accord with signals occurring on said controlled adjuster input;

a magnitude alteration controller having an output coupled to said stored threshold crossing adjustable actuator controlled adjuster input, said magnitude alteration controller being capable of providing an output signal at said output thereof directing said stored threshold crossing adjustable actuator to change magnitudes of said stored threshold crossing adjustable actuator output signals over time to oppose changes in frequencies of said signal pulse portions going beyond said first threshold value; and an output detector having a signal input coupled to said system input and having an output serving as a system output, said output detector being capable of having an output signal provided at said output thereof having indications therein of those corresponding signal pulses in said system input signal which have pulse portions going beyond a second threshold value of a selectable magnitude.

2. The system of claim 1 wherein said control detector comprises a variable gain amplifier and a magnitude comparator with said variable gain amplifier having a signal input serving as said control detector signal input, a gain control input serving as said control detector control input, and with said magnitude comparator having a signal input, a reference input and an output, said variable gain amplifier output being electrically connected to said comparator signal input.

3. The system of claim 1 wherein said control detector comprises a controlled voltage source and a magnitude comparator with said magnitude comparator having a signal input serving as said control detector signal input, a reference input and an output, and with said controlled voltage source having an input serving as said control detector control input and an output at which a voltage can be provided of a magnitude selected by control signals provided at said input thereof, said controlled voltage source output being electrically connected to said comparator reference input.

4. The system of claim 1 wherein said stored threshold crossing adjustable actuator comprises a triggered pulse generator and a time integrator with said triggered pulse generator having an input and an output at which a signal pulse of selected magnitude and duration is formed in response to an initiating signal at said input thereof, and with said integrator having a signal input and an output, said pulse generator output being electrically connected to said integrator signal input.

5. The system of claim 1 wherein said stored threshold crossing adjustable actuator and said magnitude alteration controller are together provided by portions of a microcontroller having an input serving as said stored threshold crossing adjustable actuator input and an output serving as said stored threshold crossing adjustable actuator output.

6. The system of claim 1 wherein said input signals provided at said input thereof are output signals of a mode converter provided at an output thereof which intercepts sonic pulses on a sonic waveguide and provides corresponding electrical pulses at said output thereof to form said output signals thereof.

* * * * *

UNITED STATES PATENT AND TRADEMARK OFFICE
CERTIFICATE OF CORRECTION

PATENT NO. : 5,640,109

DATED : JUNE 17, 1997

INVENTOR(S) : DAVID S. NYCE

It is certified that error appears in the above-indentified patent and that said Letters Patent is hereby corrected as shown below:

Col. 4, line 21, delete "maker", insert --marker--

Col. 14, line 28, delete "the", insert --an--

Signed and Sealed this

Fourth Day of November, 1997

Attest:

BRUCE LEHMAN

Attesting Officer

Commissioner of Patents and Trademarks